US011310906B2

(12) United States Patent
Xiao

(10) Patent No.: US 11,310,906 B2
(45) Date of Patent: Apr. 19, 2022

(54) PRINTED CIRCUIT BOARD AND DISPLAY DEVICE

(71) Applicant: TCL China Star Optoelectronics Technology Co., Ltd., Shenzhen (CN)

(72) Inventor: Jianfeng Xiao, Shenzhen (CN)

(73) Assignee: TCL China Star Ovtoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/616,454

(22) PCT Filed: Jul. 3, 2019

(86) PCT No.: PCT/CN2019/094622
§ 371 (c)(1),
(2) Date: Nov. 23, 2019

(87) PCT Pub. No.: WO2020/220465
PCT Pub. Date: Nov. 5, 2020

(65) Prior Publication Data
US 2022/0061149 A1 Feb. 24, 2022

(30) Foreign Application Priority Data
Apr. 29, 2019 (CN) .......................... 201910357023.0

(51) Int. Cl.
*H05K 1/00* (2006.01)
*H05K 1/18* (2006.01)
*H05K 7/00* (2006.01)
*H05K 1/02* (2006.01)

(52) U.S. Cl.
CPC . *H05K 1/0218* (2013.01); *H05K 2201/10136* (2013.01)

(58) Field of Classification Search
CPC ................... H05K 1/0218; H05K 2201/10136
USPC ........................................................ 361/748
See application file for complete search history.

(56) References Cited

U.S. PATENT DOCUMENTS 8,847,402 B2 * 9/2014 Funane ................. H01L 23/481
257/774

FOREIGN PATENT DOCUMENTS

| CN | 2831428 Y | * | 4/2005 |
| CN | 2831428 Y | | 10/2006 |
| CN | 109634003 A | | 4/2019 |
| CN | 109951951 A | | 6/2019 |

* cited by examiner

*Primary Examiner* — Andargie M Aychillhum
(74) *Attorney, Agent, or Firm* — Nathan & Associates; Nathan Menachem

(57) ABSTRACT

A printed circuit board and a display device are provided. A second wiring layer of the PCB includes a trace group, a system ground and an output pin group that includes power supply pins and a reference ground pin. One end of the power trace of the trace group is connected to one power supply pin, and another end of the power trace extends toward the system ground line. The insulating layer has a via hole corresponding to an overlapping portion of the power trace and the positive power supply signal line. The reference ground trace is disposed between the two power traces. The reference ground trace is between the reference ground pin and the system ground line. Voltage on the reference ground pin is stable to provide a stable power supply voltage. The ripple of the power supply voltage is reduced. The electromagnetic interference resistance is strong.

18 Claims, 5 Drawing Sheets

PRINTED CIRCUIT BOARD AND DISPLAY DEVICE

BACKGROUND

1. Field of the Invention

The present disclosure relates to the field of display technology, more particularly, to a printed circuit board and a display device.

2. Description of the Related Art

With the development of display technology, flat display devices, such as a liquid crystal display (LCD), etc., are widely used in various consumer electronic products including a mobile phone, a television, a personal digital assistant, a digital camera, a notebook computer, a desktop computer, and the like, due to their advantages of high image quality, power saving, slim body, and wide application range. As a result, flat display devices have become the mainstream in display devices.

Most of the LCD devices currently on the market are backlit LCD devices, which include a liquid crystal panel and a backlight module.

In the current LCD devices, a plurality of chip on films (COFs) are bonded to the liquid crystal panel, and then two X-boards are bonded through conductive particles and the chip on films. When operating, a drive signal is transmitted through the X-board to the chip on film so as to drive the liquid crystal panel. At present, the X board is mostly a printed circuit board (PCB), which includes a plurality of layers of mutually insulated wiring layers, and the connections between the different wiring layers are realized by via holes.

A description is provided with reference to FIG. 1. FIG. 1 is a cross-sectional schematic diagram of a printed circuit that serves as an X-board in the related art. The printed circuit board comprises a first wiring layer 1000, a second wiring layer 2000, a reference ground layer 3000, and a third wiring layer 4000, which are sequentially disposed. The first wiring layer 1000 is configured to dispose electronic components and output pins. The second wiring layer 2000 is configured to transmit a positive power supply voltage. The reference ground layer 3000 is configured to access a reference ground potential. The third wiring layer 4000 is configured to transmit a data signal. A description is provided with reference to FIG. 2. The second wiring layer 2000 comprises a positive power supply signal line 2100. The first wiring layer 1000 comprises an output pin group 1100, a system ground line 1200 spaced apart from the output pin group 1100, and a trace group 1300 disposed between the output pin group 1100 and the system ground line 1200. The output pin group 1100 comprises two power supply pins 1110 disposed apart from each other and a reference ground pin 1120 disposed between the two power supply pins 1110. The trace group 1300 comprises two power traces 1310, a reference ground trace 1320, and a connection trace 1330. The two power traces 1310 are disposed apart from each other. One end of each of the power traces 1310 is connected to one power supply pin 1110 correspondingly, and another end of the each of the power traces 1310 extends toward the system ground line 1200. The connection trace 1330 is connected to the another end of each of the power traces 1310 and is spaced apart from the system ground line 1200, and the connection trace 1330 overlaps the positive power supply signal line 2100.

An insulating layer (not shown) is disposed between the first wiring layer 1000 and the second wiring layer 2000. The insulating layer has a via hole 9000 corresponding to an overlapping portion of the connection trace 1330 and the positive power supply signal line 2100. The connection trace 1330 is connected to the positive power supply signal line 2100 through the via hole 9000. The reference ground trace 1320 is located within an area surrounded by the two power traces 1310 and the connection trace 1330, and one end of the reference ground trace 1320 is connected to the reference ground pin 1120. In this printed circuit board, the circuit between the system ground line 1200 and the connected reference ground pin 1120 and the reference ground trace 1320 is blocked by the connection trace 1330, so that the reference ground pin 1120 and the system ground line 1200 are separated, thus resulting in an unstable voltage on the reference ground pin 1120. As a result, when the printed circuit board is used to supply power to the chip on film, the ripple of the power supply increases, the power supply is unstable, and the chip on film can not function normally when the situation is severe. The electromagnetic interference (EMI) performance of the printed circuit board is thus poorer.

SUMMARY

One objective of the present disclosure is to provide a printed circuit board that can improve the stability of output power supply voltage so as to reduce the ripple of the power supply voltage. The electromagnetic interference resistance is better.

Another objective of the present disclosure is to provide a display device. The power supply voltage output from its printed circuit board has a higher stability. The ripple of the power supply voltage is less. The electromagnetic interference resistance is better.

In order to achieve the above objective, the present disclosure provides a printed circuit board. The printed circuit board comprises a first wiring layer, a second wiring layer disposed on the first wiring layer, and an insulating layer disposed between the first wiring layer and the second wiring layer. The first wiring layer comprises a positive power supply signal line. The second wiring layer comprises an output pin group, a system ground line spaced apart from the output pin group, and a trace group disposed between the output pin group and the system ground line. The output pin group comprises two power supply pins disposed apart from each other and a reference ground pin disposed between the two power supply pins. The trace group comprises two power traces disposed apart from each other and a reference ground trace. One end of each of the power traces is connected to one power supply pin correspondingly, and another end of the each of the power traces extends toward the system ground line. The each of the power traces overlaps the positive power supply signal line. The insulating layer has a via hole corresponding to an overlapping portion of the each of the power traces and the positive power supply signal line. The each of the power traces is connected to the positive power supply signal line through the corresponding via hole. The reference ground trace is disposed between the two power traces. One end of the reference ground trace is connected to the reference ground pin, and another end of the reference ground trace is connected to the system ground line.

According to the present disclosure, a printed circuit board comprises: a first wiring layer, comprising a positive power supply signal line; a second wiring layer disposed on the first wiring layer, comprising an output pin group, a system ground line spaced apart from the output pin group, and a trace group disposed between the output pin group and the system ground line; and an insulating layer disposed between the first wiring layer and the second wiring layer. The output pin group comprises two power supply pins disposed apart from each other and a reference ground pin disposed between the two power supply pins, the trace group comprises two power traces disposed apart from each other and a reference ground trace. One end of each of the power traces is connected to one power supply pin correspondingly, and another end of the each of the power traces extends toward the system ground line. Each of the power traces overlaps the positive power supply signal line, the insulating layer has a via hole corresponding to an overlapping portion of the each of the power traces and the positive power supply signal line, and each of the power traces is connected to the positive power supply signal line through the corresponding via hole. The reference ground trace is disposed between the two power traces, one end of the reference ground trace being connected to the reference ground pin, and another end of the reference ground trace being connected to the system ground line.

Optionally, a direction in which the output pin group is directed to the system ground line is defined as a first direction, and the two power supply pins are arranged in a direction perpendicular to the first direction.

Optionally, both the system ground line and the positive power supply signal line are linear, an extending direction of the system ground line and an extending direction of the positive power supply signal line are both perpendicular to the first direction.

Optionally, the trace group further comprises two capacitor traces respectively disposed between the another ends of the two power traces and the system ground line, each of the capacitor traces is connected to the another end of one power trace correspondingly.

Optionally, both the two capacitor traces are linear, lines of the two capacitor traces align, the two capacitor traces are both parallel with the system ground line.

Optionally, each of the power supply pins comprises a plurality of sub-power supply pins sequentially arranged along an arrangement direction of the two power supply pins and disposed apart from one another, the one end of each of the power traces is connected to the plurality of sub-power supply pins of the corresponding power supply pin, the reference ground pin comprises a plurality of sub-reference ground pins sequentially arranged along the arrangement direction of the two power supply pins and disposed apart from one another, the one end of the reference ground trace is connected to the plurality of sub-reference ground pins of the reference ground pin.

Optionally, each of the power supply pins comprises two sub-power supply pins, the reference ground pin comprises two or four sub-reference ground pins.

Optionally, the two power traces comprise a first power trace and a second power trace. The first power trace comprises a first line portion and a second line portion, one end of the first line portion is connected to the corresponding power supply pin, and another end of the first line portion extends toward the system ground line. One end of the second line portion is connected to the another end of the first line portion, and another end of the second line portion extends toward the system ground line. The first line portion is parallel with an arrangement direction of the output pin group and the system ground line. An angle between the second line portion and the first line portion is an acute angle. The second line portion and the positive power supply signal line overlaps. The insulating layer has a first via hole corresponding to an overlapping portion of the second line portion and the positive power supply signal line. The second line portion is connected to the positive power supply signal line through the first via hole.

The second power trace comprises a third line portion, a fourth line portion, and a fifth line portion. One end of the third line portion is connected to the corresponding power supply pin, and another end of the third line portion extends toward the system ground line. One end of the fourth line portion is connected to the another end of the third line portion, and another end of the fourth line portion extends toward the system ground line. One end of the fifth line portion is connected to the another end of the fourth line portion, and another end of the fifth line portion extends toward the system ground line. The third line portion and the fifth line portion are both parallel with the arrangement direction of the output pin group and the system ground line, an angle between the fourth line portion and the third line portion is an acute angle. The fifth line portion and the positive power supply signal line overlap. The insulating layer has a second via hole corresponding to an overlapping portion of the fifth line portion and the positive power supply signal line. The fifth line portion is connected to the positive power supply signal line through the second via hole.

Optionally, the first power trace further comprises a sixth line portion, one end of the sixth line portion is connected to the another end of the second line portion, and another end of the sixth line portion extends toward the system ground line, the sixth line portion is parallel with the arrangement direction of the output pin group and the system ground line.

The present disclosure further provides a display device comprising the above printed circuit board.

The beneficial effects the present disclosure are as follows. The second wiring layer in the printed circuit board according to the present disclosure comprises the output pin group, the system ground line, and the trace group. The output pin group comprises two power supply pins and the reference ground pin. One end of each of the power traces is connected to one power supply pin correspondingly, and another end of the each of the power traces extends toward the system ground line in the trace group. Each of the power traces overlaps the positive power supply signal line on the first wiring layer, and is connected to the positive power supply signal line through the corresponding via hole in the insulating layer. The reference ground trace in the trace group is disposed between the two power traces, and one end of the reference ground trace is connected to the reference ground pin and another end of the reference ground pin is connected to the system ground line. As a result, the reference ground pin, the reference ground trace, and the system ground line are connected together. The voltage on the reference ground pin is ensured to be stable so as to provide a stable power supply voltage. The ripple of the power supply voltage is reduced. The electromagnetic interference resistance is strong. The power supply voltage output from the printed circuit board of the display device according to the present disclosure has a higher stability. The ripple of the power supply voltage is less. The electromagnetic interference resistance is better.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

For the purpose of description rather than limitation, the following provides such specific details as a specific system structure, interface, and technology for a thorough understanding of the application. However, it is understandable by persons skilled in the art that the application can also be implemented in other embodiments not providing such specific details. In other cases, details of a well-known apparatus, circuit and method are omitted to avoid hindering the description of the application by unnecessary details.

Figure 1:
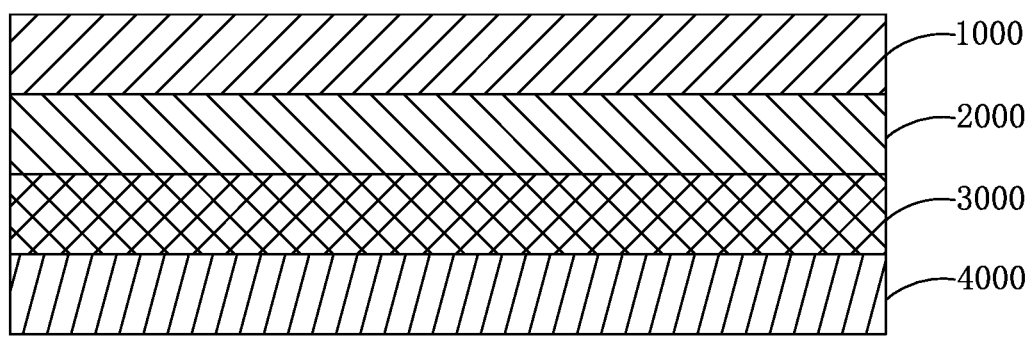
FIG. 1 is a cross-sectional schematic diagram of a printed circuit that serves as an X-board in the related art.
Figure 2:
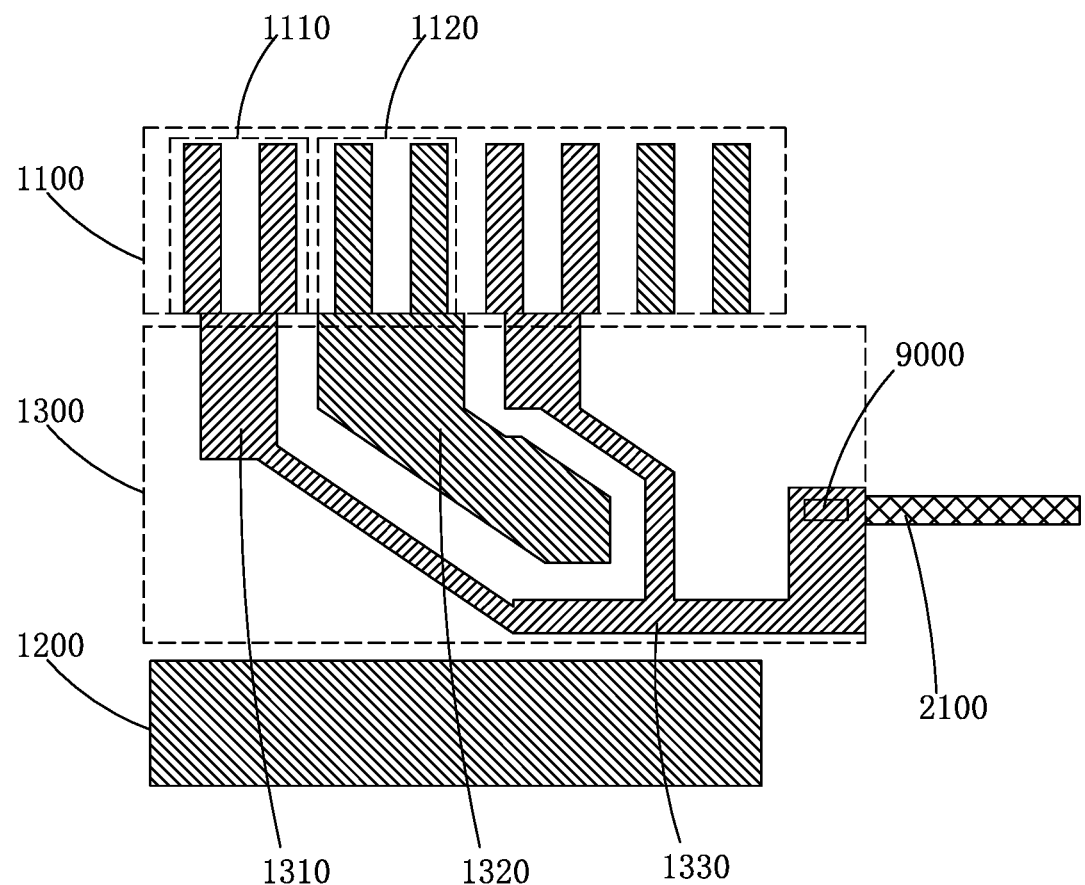
FIG. 2 is a top schematic diagram of the first wiring layer and the second wiring layer of the printed circuit board shown in FIG. 1.
Figure 3:
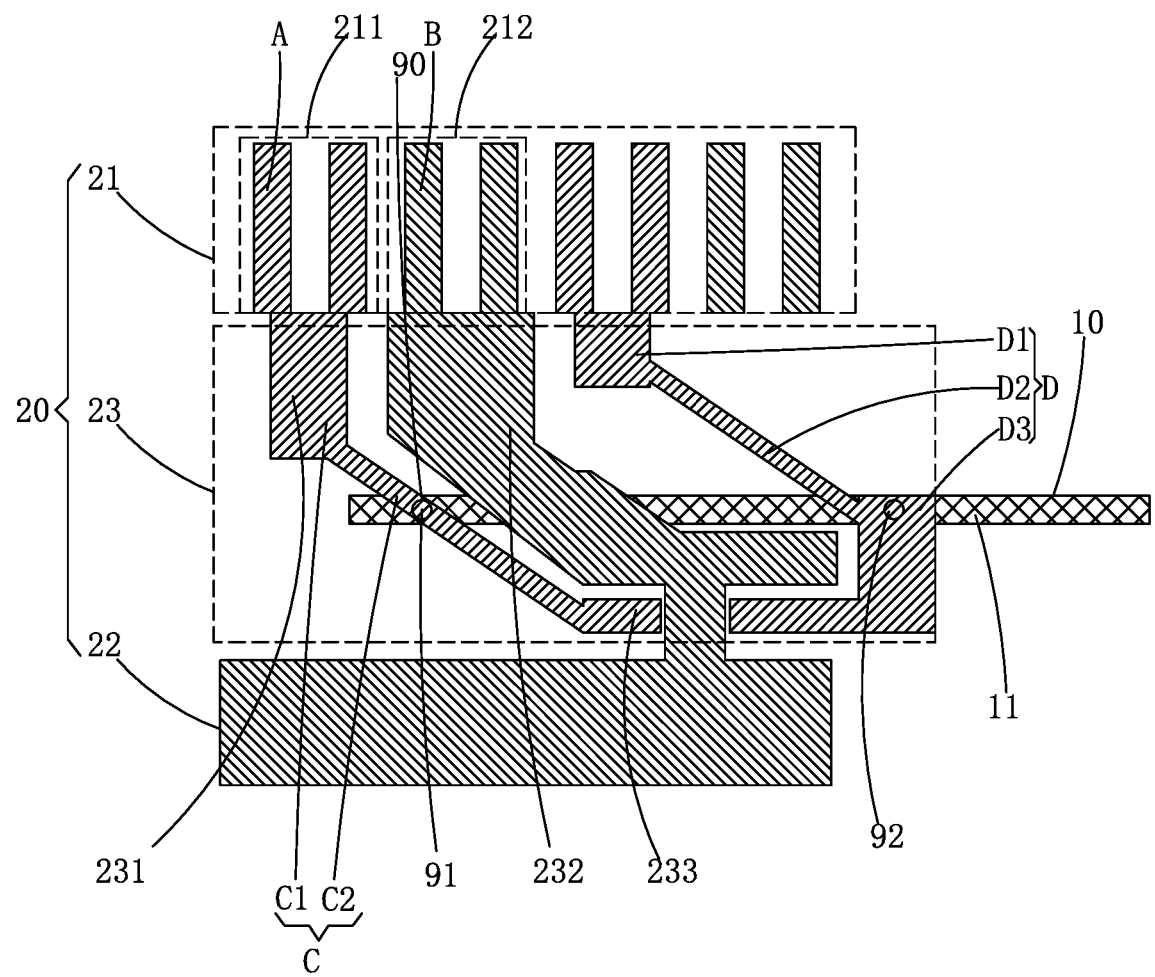
FIG. 3 is a top schematic diagram of wiring of a printed circuit board according to a first embodiment of the present disclosure.
Figure 4:
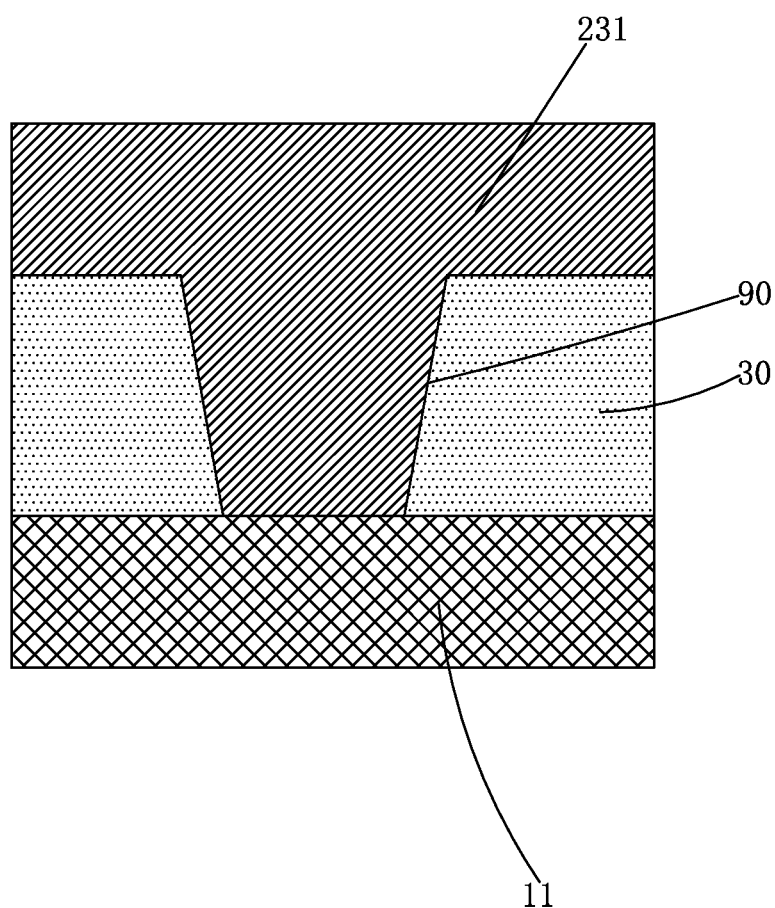
FIG. 4 is a cross-sectional schematic diagram of a printed circuit board at an overlapping portion of a power trace and a positive power supply signal line according to the present disclosure.

A description is provided with reference to FIG. 3 and FIG. 4. A printed circuit board according to a first embodiment of the present disclosure comprises a first wiring layer 10, a second wiring layer 20 disposed on the first wiring layer 10, and an insulating layer 30 disposed between the first wiring layer 10 and the second wiring layer 20. The first wiring layer 10 comprises a positive power supply signal line 11. The second wiring layer 20 comprises an output pin group 21, a system ground line 22 spaced apart from the output pin group 21, and a trace group 23 disposed between the output pin group 21 and the system ground line 22. The output pin group 21 comprises two power supply pins 211 disposed apart from each other and a reference ground pin 212 disposed between the two power supply pins 211. The trace group 23 comprises two power traces 231 disposed apart from each other and a reference ground trace 232. One end of each of the power traces 231 is connected to one power supply pin 211 correspondingly, and another end of the each of the power traces 1310 extends toward the system ground line 22. Each of the power traces 231 overlaps the positive power supply signal line 11. The insulating layer 30 has a via hole 90 corresponding to an overlapping portion of each of the power traces 231 and the positive power supply signal line 2100. Each of the power traces 231 is connected to the positive power supply signal line 11 through the corresponding via hole 90. The reference ground trace 232 is disposed between the two power traces 231. One end of the reference ground trace 232 is connected to the reference ground pin 212, and another end of the reference ground pin 212 is connected to the system ground line 22.

A description is provided with reference to FIG. 3. A direction in which the output pin group 21 is directed to the system ground line 22 is defined as a first direction, and the two power supply pins 211 are arranged in a direction perpendicular to the first direction.

A description is provided with reference to FIG. 3. Both the system ground line 22 and the positive power supply signal line 11 are linear. An extending direction of the system ground line 22 and an extending direction of the positive power supply signal line 11 are both perpendicular to the first direction.

A description is provided with reference to FIG. 3. The trace group 23 further comprises two capacitor traces 233 respectively disposed between the another ends of the two power traces 231 and the system ground line 22. Each of the capacitor traces 233 is connected to the another end of one power trace 231 correspondingly. The two capacitor traces 233 form filter capacitors with the system ground line 22, respectively.

A description is provided with reference to FIG. 3. Both the two capacitor traces 233 are linear. Lines of the two capacitor traces 233 align. The two capacitor traces 233 are both parallel with the system ground line 22.

Each of the power supply pins 211 comprises a plurality of sub-power supply pins A sequentially arranged along an arrangement direction of the two power supply pins 211 and disposed apart from one another. The one end of each of the power traces 231 is connected to the plurality of sub-power supply pins A of the corresponding power supply pin 211. The reference ground pin 212 comprises a plurality of sub-reference ground pins B sequentially arranged along the arrangement direction of the two power supply pins 211 and disposed apart from one another. The one end of the reference ground trace 232 is connected to the plurality of sub-reference ground pins B of the reference ground pin 212.

A description is provided with reference to FIG. 3. In the first embodiment of the present disclosure, each of the power supply pins 211 comprises two sub-power supply pins A. The reference ground pin 212 comprises two sub-reference ground pins B.

In the embodiment shown in FIG. 3, the two power traces 231 comprise a first power trace C and a second power trace D. The first power trace C comprises a first line portion C1 and a second line portion C2. One end of the first line portion C1 is connected to the corresponding power supply pin 211, and another end of the first line portion C1 extends toward the system ground line 22. One end of the second line portion C2 is connected to the another end of the first line portion C1, and another end of the second line portion C2 extends toward the system ground line 22. The first line portion C1 is parallel with an arrangement direction of the output pin group 21 and the system ground line 22. An angle between the second line portion C2 and the first line portion C1 is an acute angle. The second line portion C2 and the positive power supply signal line 11 overlap. The insulating layer 30 has a first via hole 91 corresponding to an overlapping portion of the second line portion C2 and the positive power supply signal line 11. The second line portion C2 is connected to the positive power supply signal line 11 through the first via hole 91. The second power trace D comprises a third line portion D1, a fourth line portion D2, and a fifth line portion C3. One end of the third line portion D1 is connected to the corresponding power supply pin 211, and another end of the third line portion D1 extends toward the system ground line 22. One end of the fourth line portion D2 is connected to the another end of the third line portion D1, and another end of the fourth line portion D2 extends toward the system ground line 22. One end of the fifth line portion D3 is connected to the another end of the fourth line portion D2, and another end of the fifth line portion D3 extends toward the system ground line 22. The third line portion D1 and the fifth line portion D3 are both parallel with the arrangement direction of the output pin group 21 and the system ground line 22. An angle between the fourth line portion D2 and the third line portion D1 is an acute angle. The fifth line portion D3 and the positive power supply signal line 11 overlap. The insulating layer 30 has a second via hole 92 corresponding to an overlapping portion of the fifth line portion D3 and the positive power supply signal line 11. The fifth line portion D3 is connected to the positive power supply signal line 11 through the second via hole 92.

Figure 5:
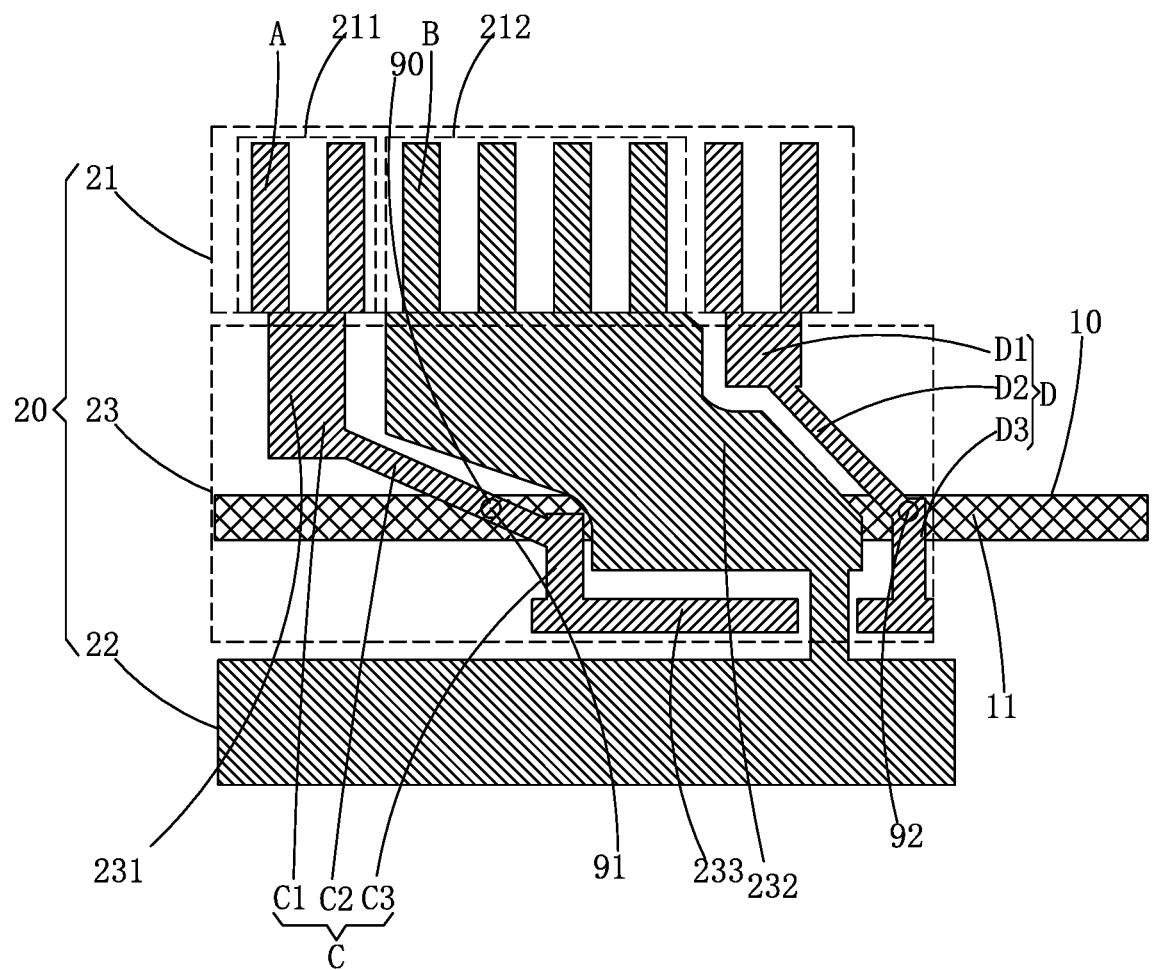
FIG. 5 is a top schematic diagram of wiring of a printed circuit board according to a second embodiment of the present disclosure.

A description is provided with reference to FIG. 5. A printed circuit board according to a second embodiment of the present disclosure differs from the printed circuit board of the first embodiment in that the reference ground pin 212 comprises four sub-reference ground pins B and the first power trace C further comprises a sixth line portion C3. One end of the sixth line portion C3 is connected to the another end of the second line portion C2, and another end of the sixth line portion C3 extends toward the system ground line 22. The sixth line portion C3 is parallel with the arrangement direction of the output pin group 21 and the system ground line 22. Since the rest are the same as those of the first embodiment described above, a description in this regard is not provided.

The printed circuit board according to the present disclosure is so disposed that one end of each of the power traces 231 is connected to the power supply pin 211 correspondingly, and another end of the each of the power traces 231 extends toward the system ground line 22. In addition, each of the power traces 231 overlaps the positive power supply signal line 11. The insulating layer 30 has the via hole 90 corresponding to the overlapping portion of each of the power traces 231 and the positive power supply signal line 11. Each of the power traces 231 is connected to the positive power supply signal line 11 through the corresponding via hole 90. The reference ground trace 232 is disposed between the two power traces 231. One end of the reference ground trace 232 is connected to the reference ground pin 212 and another end of the reference ground pin 212 is connected to the system ground line 22, so that the reference ground pin 212, the reference ground trace 232, and the system ground line 22 are connected together. The voltage on the reference ground pin 212 is ensured to be stable. The printed circuit board that is used as an X-board can provide a stable power supply voltage to the COF in the display device to reduce the ripple of the power supply voltage. The electromagnetic interference resistance is strong.

The present disclosure further provides a display device comprising the above printed circuit board. The structure of the printed circuit board is not described repeatedly here. The printed circuit board serves as an X-board of an LCD device, and is electrically connected to a COF in the display device through its output pin group 21.

The printed circuit board of the display device according to the present disclosure is so disposed that one end of each of the power traces 231 is connected to the power supply pin 211 correspondingly, and another end of the each of the power traces 231 extends toward the system ground line 22. In addition, each of the power traces 231 overlaps the positive power supply signal line 11. The insulating layer 30 has the via hole 90 corresponding to the overlapping portion of each of the power traces 231 and the positive power supply signal line 11. Each of the power traces 231 is connected to the positive power supply signal line 11 through the corresponding via hole 90. The reference ground trace 232 is disposed between the two power traces 231. One end of the reference ground trace 232 is connected to the reference ground pin 212 and another end of the reference ground pin 212 is connected to the system ground line 22, so that the reference ground pin 212, the reference ground trace 232, and the system ground line 22 are connected together. The voltage on the reference ground pin 212 is ensured to be stable. The printed circuit board that is used as an X-board can provide a stable power supply voltage to the COF in the display device to reduce the ripple of the power supply voltage. The electromagnetic interference resistance is strong.

In sum, the second wiring layer in the printed circuit board according to the present disclosure comprises the output pin group, the system ground line, and the trace group. The output pin group comprises two power supply pins and the reference ground pin. One end of each of the power traces is connected to one power supply pin correspondingly, and another end of the each of the power traces extends toward the system ground line in the trace group. Each of the power traces overlaps the positive power supply signal line on the first wiring layer, and is connected to the positive power supply signal line through the corresponding via hole in the insulating layer. The reference ground trace in the trace group is disposed between the two power traces, and one end of the reference ground trace is connected to the reference ground pin and another end of the reference ground pin is connected to the system ground line. As a result, the reference ground pin, the reference ground trace, and the system ground line are connected together. The voltage on the reference ground pin is ensured to be stable so as to provide a stable power supply voltage. The ripple of the power supply voltage is reduced. The electromagnetic interference resistance is strong. The power supply voltage output from the printed circuit board of the display device according to the present disclosure has a higher stability. The ripple of the power supply voltage is less. The electromagnetic interference resistance is better.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A printed circuit board comprising:
a first wiring layer, comprising a positive power supply signal line;
a second wiring layer disposed on the first wiring layer, comprising an output pin group, a system ground line spaced apart from the output pin group, and a trace group disposed between the output pin group and the system ground line; and
an insulating layer disposed between the first wiring layer and the second wiring layer;
wherein the output pin group comprises two power supply pins disposed apart from each other and a reference ground pin disposed between the two power supply pins, the trace group comprises two power traces disposed apart from each other and a reference ground trace;
wherein one end of each of the power traces is connected to one power supply pin correspondingly, and another end of the each of the power traces extends toward the system ground line;
wherein each of the power traces overlaps the positive power supply signal line, the insulating layer has a via hole corresponding to an overlapping portion of the each of the power traces and the positive power supply signal line, and each of the power traces is connected to the positive power supply signal line through the corresponding via hole;

wherein the reference ground trace is disposed between the two power traces, one end of the reference ground trace being connected to the reference ground pin, and another end of the reference ground trace being connected to the system ground line.

2. The printed circuit board as claimed in claim 1, wherein a direction in which the output pin group is directed to the system ground line is defined as a first direction, and the two power supply pins are arranged in a direction perpendicular to the first direction.

3. The printed circuit board as claimed in claim 2, wherein both the system ground line and the positive power supply signal line are linear, an extending direction of the system ground line and an extending direction of the positive power supply signal line are both perpendicular to the first direction.

4. The printed circuit board as claimed in claim 3, wherein the trace group further comprises two capacitor traces respectively disposed between the another ends of the two power traces and the system ground line, each of the capacitor traces is connected to the another end of one power trace correspondingly.

5. The printed circuit board as claimed in claim 4, wherein both the two capacitor traces are linear, lines of the two capacitor traces align, the two capacitor traces are both parallel with the system ground line.

6. The printed circuit board as claimed in claim 1, wherein each of the power supply pins comprises a plurality of sub-power supply pins sequentially arranged along an arrangement direction of the two power supply pins and disposed apart from one another, the one end of each of the power traces is connected to the plurality of sub-power supply pins of the corresponding power supply pin, the reference ground pin comprises a plurality of sub-reference ground pins sequentially arranged along the arrangement direction of the two power supply pins and disposed apart from one another, the one end of the reference ground trace is connected to the plurality of sub-reference ground pins of the reference ground pin.

7. The printed circuit board as claimed in claim 6, wherein each of the power supply pins comprises two sub-power supply pins, the reference ground pin comprises two or four sub-reference ground pins.

8. The printed circuit board as claimed in claim 1, wherein the two power traces comprise a first power trace and a second power trace;

the first power trace comprising a first line portion and a second line portion, one end of the first line portion being connected to the corresponding power supply pin, and another end of the first line portion extending toward the system ground line, one end of the second line portion being connected to the another end of the first line portion, and another end of the second line portion extending toward the system ground line, the first line portion being parallel with an arrangement direction of the output pin group and the system ground line, an angle between the second line portion and the first line portion being an acute angle, the second line portion and the positive power supply signal line overlapping, the insulating layer having a first via hole corresponding to an overlapping portion of the second line portion and the positive power supply signal line, the second line portion being connected to the positive power supply signal line through the first via hole;

the second power trace comprising a third line portion, a fourth line portion, and a fifth line portion, one end of the third line portion being connected to the corresponding power supply pin, and another end of the third line portion extending toward the system ground line, one end of the fourth line portion being connected to the another end of the third line portion, and another end of the fourth line portion extending toward the system ground line, one end of the fifth line portion being connected to the another end of the fourth line portion, and another end of the fifth line portion extending toward the system ground line, the third line portion and the fifth line portion being both parallel with the arrangement direction of the output pin group and the system ground line, an angle between the fourth line portion and the third line portion being an acute angle, the fifth line portion and the positive power supply signal line overlapping, the insulating layer having a second via hole corresponding to an overlapping portion of the fifth line portion and the positive power supply signal line, the fifth line portion being connected to the positive power supply signal line through the second via hole.

9. The printed circuit board as claimed in claim 8, wherein the first power trace further comprises a sixth line portion, one end of the sixth line portion is connected to the another end of the second line portion, and another end of the sixth line portion extends toward the system ground line, the sixth line portion is-parallel with the arrangement direction of the output pin group and the system ground line.

10. A display device comprising a printed circuit board, the printed circuit board comprising:

a first wiring layer, comprising a positive power supply signal line;

a second wiring layer disposed on the first wiring layer, comprising an output pin group, a system ground line spaced apart from the output pin group, and a trace group disposed between the output pin group and the system ground line; and an insulating layer disposed between the first wiring layer and the second wiring layer;

wherein the output pin group comprises two power supply pins disposed apart from each other and a reference ground pin disposed between the two power supply pins, the trace group comprises two power traces disposed apart from each other and a reference ground trace;

wherein one end of each of the power traces is connected to one power supply pin correspondingly, and another end of the each of the power traces extends toward the system ground line;

wherein each of the power traces overlaps the positive power supply signal line, the insulating layer has a via hole corresponding to an overlapping portion of the each of the power traces and the positive power supply signal line, and each of the power traces is connected to the positive power supply signal line through the corresponding via hole;

wherein the reference ground trace is disposed between the two power traces, one end of the reference ground trace being connected to the reference ground pin, and another end of the reference ground trace being connected to the system ground line.

11. The display device as claimed in claim 10, wherein a direction in which the output pin group is directed to the system ground line is defined as a first direction, and the two power supply pins are arranged in a direction perpendicular to the first direction.

12. The display device as claimed in claim 11, wherein both the system ground line and the positive power supply signal line are linear, an extending direction of the system ground line and an extending direction of the positive power supply signal line are both perpendicular to the first direction.

13. The display device as claimed in claim 12, wherein the trace group further comprises two capacitor traces respectively disposed between the another ends of the two power traces and the system ground line, each of the capacitor traces is connected to the another end of one power trace correspondingly.

14. The display device as claimed in claim 13, wherein both the two capacitor traces are linear, lines of the two capacitor traces align, the two capacitor traces are both parallel with the system ground line.

15. The display device as claimed in claim 10, wherein each of the power supply pins comprises a plurality of sub-power supply pins sequentially arranged along an arrangement direction of the two power supply pins and disposed apart from one another, the one end of each of the power traces is connected to the plurality of sub-power supply pins of the corresponding power supply pin, the reference ground pin comprises a plurality of sub-reference ground pins sequentially arranged along the arrangement direction of the two power supply pins and disposed apart from one another, the one end of the reference ground trace is connected to the plurality of sub-reference ground pins of the reference ground pin.

16. The display device as claimed in claim 15, wherein each of the power supply pins comprises two sub-power supply pins, the reference ground pin comprises two or four sub-reference ground pins.

17. The printed circuit board as claimed in claim 10, wherein the two power traces comprise a first power trace and a second power trace;

the first power trace comprising a first line portion and a second line portion, one end of the first line portion being connected to the corresponding power supply pin, and another end of the first line portion extending toward the system ground line, one end of the second line portion being connected to the another end of the first line portion, and another end of the second line portion extending toward the system ground line, the first line portion being parallel with an arrangement direction of the output pin group and the system ground line, an angle between the second line portion and the first line portion being an acute angle, the second line portion and the positive power supply signal line overlapping, the insulating layer having a first via hole corresponding to an overlapping portion of the second line portion and the positive power supply signal line, the second line portion being connected to the positive power supply signal line through the first via hole;

the second power trace comprising a third line portion, a fourth line portion, and a fifth line portion, one end of the third line portion being connected to the corresponding power supply pin, and another end of the third line portion extending toward the system ground line, one end of the fourth line portion being connected to the another end of the third line portion, and another end of the fourth line portion extending toward the system ground line, one end of the fifth line portion being connected to the another end of the fourth line portion, and another end of the fifth line portion extending toward the system ground line, the third line portion and the fifth line portion being both parallel with the arrangement direction of the output pin group and the system ground line, an angle between the fourth line portion and the third line portion being an acute angle, the fifth line portion and the positive power supply signal line overlapping, the insulating layer having a second via hole corresponding to an overlapping portion of the fifth line portion and the positive power supply signal line, the fifth line portion being connected to the positive power supply signal line through the second via hole.

18. The printed circuit board as claimed in claim 17, wherein the first power trace further comprises a sixth line portion, one end of the sixth line portion is connected to the another end of the second line portion, and another end of the sixth line portion extends toward the system ground line, the sixth line portion is-parallel with the arrangement direction of the output pin group and the system ground line.

* * * * *

UNITED STATES PATENT AND TRADEMARK OFFICE
CERTIFICATE OF CORRECTION

| | |
|---|---|
| PATENT NO. | : 11,310,906 B2 |
| APPLICATION NO. | : 16/616454 |
| DATED | : April 19, 2022 |
| INVENTOR(S) | : Jianfeng Xiao |

Page 1 of 1

It is certified that error appears in the above-identified patent and that said Letters Patent is hereby corrected as shown below:

On the Title Page

(73) Assignee should read:
TCL China Star Optoelectronics
Technology Co., Ltd., Shenzhen (CN)

Signed and Sealed this
Twenty-fifth Day of October, 2022

Katherine Kelly Vidal
*Director of the United States Patent and Trademark Office*